United States Patent [19]
Hirano et al.

[11] Patent Number: 5,751,650
[45] Date of Patent: May 12, 1998

[54] ELECTRIC SIGNAL SUPPLY CIRCUIT AND SEMICONDUCTOR MEMORY DEVICE

[75] Inventors: Hiroshige Hirano, Nara; Tetsuji Nakakuma, Kyoto, both of Japan

[73] Assignee: Matsushita Electronics Corporation, Osaka, Japan

[21] Appl. No.: 724,664

[22] Filed: Oct. 1, 1996

[51] Int. Cl.$^6$ .................................................. G11C 5/06
[52] U.S. Cl. ........................... 365/210; 365/51; 365/63
[58] Field of Search ................................ 365/63, 51, 210

[56] References Cited

U.S. PATENT DOCUMENTS

| | | | |
|---|---|---|---|
| 5,175,704 | 12/1992 | Minagawa et al. | 365/63 |
| 5,321,658 | 6/1994 | Ishimura et al. | 365/63 |
| 5,491,662 | 2/1996 | Pezzini | 365/210 |
| 5,539,695 | 7/1996 | Saito et al. | 365/210 |

*Primary Examiner*—Son T. Dinh
*Attorney, Agent, or Firm*—McDermott, Will & Emery

[57] ABSTRACT

In an electric signal supply circuit, a signal generating source and a plurality of circuit cells are connected to each other by a wire line through resistors. Signal wire lines from the signal generating source to the respective circuit cells are formed in the form of a pyramid, and therefore, delay time differences to the circuit cells are reduced. Since delay time differences in a signal to the circuit cells from the signal generating source which is disposed at ends of the plurality of circuit cells are smaller, a circuit operation is stable.

18 Claims, 9 Drawing Sheets

ELECTRIC SIGNAL SUPPLY CIRCUIT AND SEMICONDUCTOR MEMORY DEVICE

BACKGROUND OF THE INVENTION

The present invention relates to an electric signal supply circuit and a semiconductor memory device, and more particularly, to measures for adjusting a delay time of a signal.

In recent years, as semiconductor devices have been integrated in large scale, adjustment of a delay time in transmission of a signal to a circuit cell has become a problem. In a large scale integrated semiconductor memory device in particular, a difference in delay time in signal transmission associated with an arranged position of memory cells causes malfunction, and an effort to avoid this leads to difficulty in ensuring a high-speed operation. As described in U.S. Pat. No. 4,873,664, etc., for instance, in a non-volatile memory which has capacitors of memory cells formed by a ferroelectric material, a voltage is applied to cell plate electrodes of the capacitors of the memory cells and a difference in the quantities of electric charges between a main memory cell and a reference memory cell (i.e., dummy memory cell) is amplified by an amplifier as output data. At this stage, if there is a difference in delay times in signal transmission to plate electrodes of the main memory cell and the reference memory cell, the difference in the quantities of electric charges between the two memory cells is not outputted correctly, which in turn results in malfunction in some cases.

A description will be given on an example of a conventional structure as above where a difference in delay times in transmission of signals from an electric signal generating source to the respective circuit cells, with reference to the block circuitry diagram in FIG. 15 and the diagram in FIG. 16 which shows a relationship between time and a signal level voltage.

Figure 15:
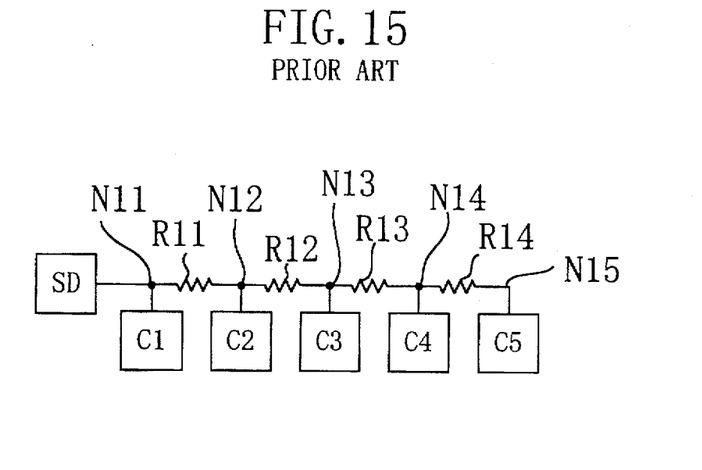
FIG. 15 is a block diagram showing a schematic structure of a conventional electric signal supply circuit.

In FIG. 15, a relationship between reference symbols and the names of the elements is as described below. Denoted at SD is the signal generating source, denoted at C1 to C5 are the circuit cells, denoted at R11 to R14 are resistors, and denoted at N11 to N15 are nodes. In the circuit shown in the drawing, the node N1 is connected to the signal generating source SD, and the four nodes N12 to N15 are connected in series in this order to the node N11 through the resistors R11 to R14. The circuit cells C1 to C5 are connected respectively to the nodes N11 to N15. That is, a signal outputted from the signal generating source SD is supplied to the circuit cell C1 without the resistors, to the circuit cell C2 through the resistor R11, to the circuit cell C3 through the resistors R11 and R12, to the circuit cell C4 through the resistors R11, R12 and R13, and to the circuit cell C5 through the resistors R11, R12, R13 and R14.

However, the signal supply circuit having such a structure as above has the following problems.

Figure 16:
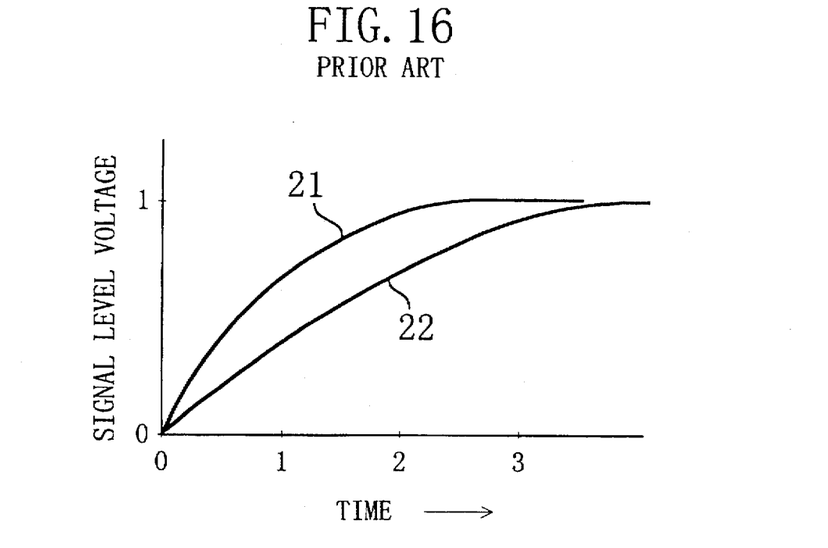
FIG. 16 is a diagram showing a relationship between time and a signal level voltage in the conventional electric signal supply circuit.

In the electric signal supply circuit having such a structure as above, when a signal at the signal generating source SD is changed from a logical voltage "L" to a logical voltage "H," the signal level voltage at the node N11 is as shown by a signal level voltage curve 21 in FIG. 16 while the signal level voltage at the node N15 is as shown by a signal level voltage curve 22 in FIG. 16. In short, a time which is required until the node N15 reaches the level "1" is longer than a time which is required until the node N11 reaches the level "1." This is attributed to a capacitance including parasitic capacitances of the respective circuit cells C1 to C5 and the resistors R11 to R14. It then follows that a delay time in a signal at the node N15 is larger than a delay time in a signal at the node N11. Such delay time differences between the respective circuit cells present a problem to a circuit operation.

The signal generating source SD of FIG. 15 is a voltage supply circuit for the plate electrodes of the memory cells, the respective circuit cells C1 to C5 are the main memory cells and the reference memory cells. As an example of a memory cell capacitor, a non-volatile memory which uses a ferroelectric material will be considered. As described above, when a voltage is supplied from the voltage supply circuit, due to a difference in delay times in signal transmission, a time the plate electrode of the main memory cell needs to reach a predetermined level is different from a time the plate electrode of the reference memory cell needs to reach a predetermined level, and hence, potentials which are read from the respective memory cells are each shifted from potentials otherwise which are read without any delay times in the signal to the plate electrodes of the respective memory cells. To prevent such mis-detection, it is necessary to operate a sense amplifier after a sufficient time has passed so that potentials to be read are established. This makes a high-speed operation difficult. Further, depending on the timing of operating the sense amplifier, this causes malfunction.

SUMMARY OF THE INVENTION

The present invention has been made to solve such problems. Accordingly, an object of the present invention is to provide for an electric signal supply circuit and a semiconductor memory device which stably operate at a high speed, owing to use of means which reduces delay time differences in a signal which is supplied to a number of circuit cells as much as possible.

A first electric signal supply circuit according to the present invention comprises: a plurality of circuit cells including at least a first circuit cell and a second circuit cell; an electric signal generating source for generating a signal which is to be supplied to the respective circuit cells; and a wire line which is lead from the electric signal generating source and connected at tip with the respective circuit cells, wherein a resistance value in the wire line between the electric signal generating source and the first circuit cell is set approximately the same as a resistance value in the wire line between the electric signal generating source and the second circuit cell.

In such a structure as described above, delay times in a signal which is supplied to the first and the second circuit cells from the electric signal generating source are approximately equal to each other. This enables a high-speed operation and promises a stable circuitry operation with less chances of malfunction.

A second electric signal supply circuit according to the present invention comprises: a plurality of circuit cells; an electric signal generating source for generating a signal which is to be supplied to the respective circuit cells; and a wire line which is lead from the electric signal generating source, branched out in a hierarchy configuration and connected at tip with the respective circuit cells.

In the electric signal supply circuit having such a structure as described above, since an electric signal is transmitted to the plurality of circuit cells through the wire which has a pyramid-shaped configuration extending from the electric signal generating source, a difference in impedance between the electric signal generating source and each circuit cell is reduced, and therefore, delay time differences in the signal which is supplied to the circuit cells from the electric signal generating source become small.

The second electric signal supply circuit may further have the following structures.

The wire line may have a first hierarchy layer which is led from the electric signal generating source and a second hierarchy layer which is branched out at one branching point from the first hierarchy layer and connected at tip to the respective circuit cells, so that a resistance value in the wire line from the electric signal generating source to the branching point in the first hierarchy layer is larger than a resistance value in the wire line between the circuit cells in the second hierarchy layer.

Since this structure allows the resistance value in the first hierarchy layer, which provides a common resistance to the respective circuit cells in paths of the signal which is transmitted to the respective circuit cells, to be large, the resistance value in the second hierarchy layer exerts a smaller influence over delay times in the respective circuit cells. Hence, delay time differences between the respective circuit cells are reduced.

Alternatively, the wire line may have a first hierarchy layer which is led from the electric signal generating source and a second hierarchy layer which is branched out at one branching point from the first hierarchy layer and connected at tip to the respective circuit cells, and tip portions in the second hierarchy layer may be connected to the respective circuit cells through resistors.

This allows that the resistance values of the resistors are larger than a resistance value in the wire line in the first hierarchy layer from the electric signal generating source to the branching point branching to the second hierarchy layer and also than a resistance value in the wire line between the circuit cells in the second hierarchy layer.

In such a structure, since the resistors are inserted between the tip portions in the second hierarchy layer and the respective circuit cells, an influence of a capacitance including parasitic capacitances of the respective circuit cells does not easily appear at the nodes at the tip portions in the second hierarchy layer, and further, delay time differences between the respective circuit cells are reduced.

A third electric signal supply circuit according to the present invention comprises: a plurality of circuit cells; an electric signal generating source for generating a signal which is to be supplied to the respective circuit cells; a first layer wire line which is connected to the electric signal generating source; and a second layer wire line which is connected to the respective circuit cells, wherein the first layer wire line and the second layer wire line are connected to each other at a plurality of contacts including at least a first contact and a second contact, and an electric signal is supplied from the electric signal generating source through at least the two contacts to at least circuit cells except for circuit cells which are disposed at the both ends.

This structure reduces delay time differences between the respective circuit cells as much as possible.

The third electric signal supply circuit may further have the following structures.

A resistance value in the path between one end portion of the second layer wire line and the first contact may be approximately half a resistance value in the path between the first contact and the second contact in the second layer wire line.

This structure further reduces delay time differences between the respective circuit cells.

According to the above construction, decreased is time delay differences between the respective circuit cells. Further, each circuit cell is layouted with regular intervals when the wire lines has the same width, which simplifies the layout.

Alternatively, a wire length between one end portion of the second layer wire line and the first contact may be approximately half a wire length between the first contact and the second contact in the second layer wire line.

This structure reduces delay time differences between the respective circuit cells. Further, of the circuitry from the electric signal generating source to the respective circuit cells, the length of the path in which a signal makes a detour and reaches the farthest circuit cell is shortened, and therefore, the value of a delay time itself is reduced.

Preferably, the circuit cells above include at least a first, a second and a third circuit cells, a first resistor and a second resistor are arranged in the first layer wire line in this order from one end, the first layer wire line is divided by the resistors into a first node to a third node in this order from the one end, a first resistor to a fourth resistor are arranged in the second layer wire line in this order from one end which corresponds to the one end of the first layer wire line, the second layer wire line is divided by the resistors into a first node to a fifth node in this order from the one end, the first, the third and the fifth nodes are connected to the first, the second and the third circuit cells, respectively, the first contact is formed between the first node in the first layer wire line and the second node in the second layer wire line, the second contact is formed between the third node in the first layer wire line and the fourth node in the second layer wire line, the electric signal generating source is connected to the second node in the first layer wire line, and the resistance value of the second resistor is larger than the resistance value of the first resistor in the second layer wire line.

In this structure, it is possible to reduce a difference in delay times as much as possible between the circuit cell to which an electric signal is supplied through two paths and the circuit cell to which an electric signal is supplied through one path.

In this case, it is desirable that the resistance value of the first resistor in the first layer wire line is approximately the same as the resistance value of the second resistor in the first layer wire line, and that the resistance value of the second resistor is $\sqrt{2}$ times as large as the resistance value of the first resistor.

In this structure, it is possible to almost eliminate a difference in delay times between the circuit cell to which an electric signal is supplied through two paths and the circuit cell to which an electric signal is supplied through one path.

Alternatively, the circuit cells includes at least a first, a second and a third circuit cells, a first resistor to a fourth resistor are arranged in the first layer wire line in this order from one end, the first layer wire line is divided by the resistors into a first node to a fifth node in this order from the one end, a first resistor to a fourth resistor are arranged in the second layer wire line in this order from one end which corresponds to the one end of the first layer wire line, the second layer wire line is divided by the resistors into a first node to a fifth node in this order from the one end, the first, the third and the fifth nodes are connected to the first, the second and the third circuit cells, respectively, the first, the second, the fourth and the fifth nodes are connected to each other at a first, a second, a third and a fourth contacts, respectively, between the first layer wire line and the second layer wire line, the electric signal generating source is connected to the second node in the first layer wire line, the resistance value of the first resistor is approximately equal to the resistance value of the second resistor in the first layer wire line, the resistance value of the first resistor in the first layer wire line is approximately equal to the resistance value of the third resistor in the second layer wire line, the resistance value of the second resistor is approximately equal to the resistance value of the first resistor in the second layer wire line.

In this structure, it is possible to almost eliminate a difference in delay times between the circuit cells which are disposed at end portions and the circuit cells which are disposed at center portions.

A first semiconductor memory device according to the present invention comprises: a plurality of circuit cells, including a first and a second circuit cells which function as main memory cells and a third circuit cell which functions as a reference memory cell; and an electric signal generating source which is connected to the circuit cells through wire lines, the electric signal generating source generating a signal which is supplied to each circuit cell, wherein of resistance values in the wire lines between the electric signal generating source and the respective circuit cells, the largest resistance value is used as the resistance value in the wire lines between the electric signal generating source and the first circuit cell, of resistance values in the wire lines between the electric signal generating source and the respective circuit cells, the smallest resistance value is used as the resistance value in the wire lines between the electric signal generating source and the second circuit cell, and the resistance value in the wire lines between the electric signal generating source and the third circuit cell is set as a value between the largest resistance value and the smallest resistance value.

In the semiconductor memory device having such a structure, since delay time differences become uniform between the reference memory cell and the main memory cells to which the signal is transmitted with the largest or the smallest delay time, the largest delay time difference among the delay time differences between the main memory cells and the reference memory cell in the semiconductor memory device is reduced. Hence, a high-speed operation is possible even in a non-volatile memory in which the electric signal generating source is a drive circuit for driving plate electrodes of the memory cells and the circuit cells are the main memory cells and the reference memory cell and in which a ferroelectric material is used to form memory cell capacitors, and further, degrading in or variations between the ferroelectric capacitors does not easily cause the non-volatile memory to malfunction. Thus, the semiconductor memory device is highly reliable.

A second semiconductor memory device according to the present invention comprises: a plurality of circuit cells, including a first and a second circuit cells which function as main memory cells and a third circuit cell which functions as a reference memory cell; and an electric signal generating source which is connected to the circuit cells through wire lines, the electric signal generating source generating a signal which is supplied to each circuit cell, wherein the third circuit cell is disposed between the first and the second circuit cells.

This structure makes it possible to reduce a delay time difference between the first circuit cell which serves as the main memory cell and the third circuit cell which serves as the reference memory cell and a delay time difference between the second circuit cell which serves as the main memory cell and the third circuit cell, as much as possible.

A third semiconductor memory device according to the present invention comprises: a plurality of circuit cells; and an electric signal generating source which is connected to the circuit cells through wire lines, the electric signal generating source generating a signal which is supplied to each circuit cell, wherein the plurality of circuit cells consist of a plurality of main memory cells and a plurality of reference memory cells.

In this structure, it is possible to select a reference memory which operates simultaneously with each main memory cell with the smallest delay time, in accordance with a positional relationship regarding an arrangement within the semiconductor memory device. Even when a memory capacity is particularly large, it is possible to reduce a delay time difference.

Preferably, in the third semiconductor memory device, the plurality of circuit cells include a first and a second circuit cells which function as main memory cells and a third and a fourth circuit cells which function as reference memory cells, the resistance value in the wire lines between the electric signal generating source and the first circuit cell is approximately equal to the resistance value in the wire lines between the electric signal generating source and the third circuit cell, the resistance value in the wire lines between the electric signal generating source and the second circuit cell is approximately equal to the resistance value in the wire lines between the electric signal generating source and the fourth circuit cell.

The plurality of circuit cells may include a first and a second circuit cells which function as main memory cells and a third and a fourth circuit cells which function as reference memory cells, the first circuit cell and the third circuit cell may be selected at the same time, and the second circuit cell and the fourth circuit cell may be selected at the same time.

Since this structure allows almost no delay time difference between each main memory cell and each reference memory cell, it is possible to provide for a semiconductor memory device, such as a ferroelectric memory, which is extremely reliable and which can operate at a high speed.

DESCRIPTION OF THE PREFERRED EMBODIMENTS

In the following, a detailed description will be given on electric signal supply circuits and semiconductor memory devices according to preferred embodiments of the present invention, with reference to the associated drawings.

<First Preferred Embodiment>

First, a first preferred embodiment of the present invention will be described with reference to FIGS. 1 and 2.

Figure 1:
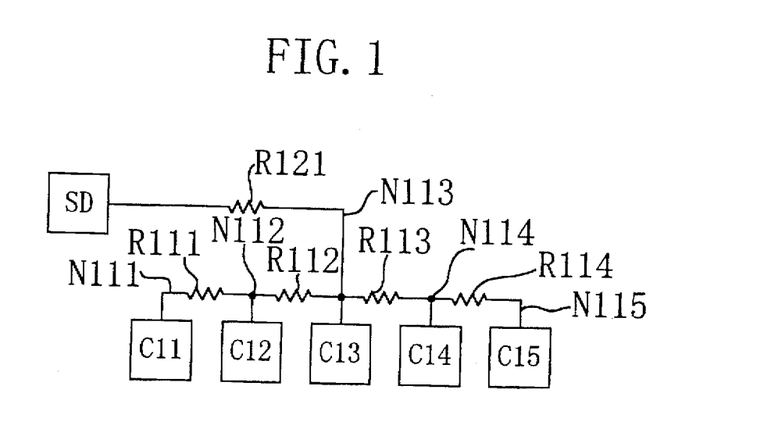
FIG. 1 is a block diagram showing a schematic structure of an electric signal supply circuit according to a first preferred embodiment.

In FIG. 1, a relationship between reference symbols and the names of the elements is as described below. Denoted at SD is a signal generating source, denoted at C11 to C15 are circuit cells, denoted at R111 to R121 are resistors, and denoted at N111 to N115 are nodes. It should be noted that in all of the embodiments, each resistors is generally a member for representing resistance of a signal wire line and such a resistor member other than the wire line is not intervened actually. Wherein, another resistor member may be arranged if the signal wire line has so small resistance as to be ignored.

In the circuit shown in FIG. 1, the node N113 is connected to the signal generating source SD through the resistor R121, while the circuit cells C11 to C15 are respectively connected to the nodes N111 to N115. The resistor R111 is inserted between the nodes N111 and N112, the resistor R112 is inserted between the nodes N112 and N113, the resistor R113 is inserted between the nodes N113 and N114, and the resistor R114 is inserted between the nodes N114 and N115. That is, a signal from the signal generating source SD is supplied to the circuit cell C11 through the resistors R121, R112 and R111, to the circuit cell C12 through the resistors R121 and R112, to the circuit cell C13 through the resistor R121, to the circuit cell C14 through the resistors R121 and R113, and to the circuit cell C15 through the resistors R121, R113 and R114. More precisely, the present preferred embodiment is different from the conventional structure described earlier in that the signal generating source SD which is disposed at end portions of the circuit cells C11 to C15 is connected to the node N113, which is the center one of the node array which is connected to the circuit cells C11 to C15, through the resistor R121.

Figure 2:
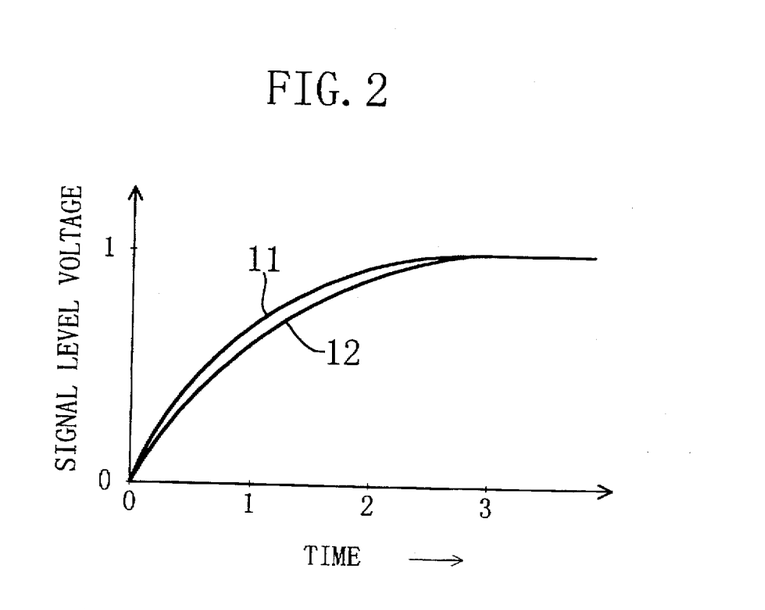
FIG. 2 is a diagram showing a relationship between time and a signal level voltage in the electric signal supply circuit according to the first preferred embodiment.

FIG. 2 shows a signal transmission characteristic in the electric signal supply circuit according to the present preferred embodiment. As shown in FIG. 2, a signal level voltage at the node N113 when a signal at the signal generating source SD is changed from a logical voltage "L" to a logical voltage "H" is as shown by a signal level voltage curve 11, while a signal level voltage at the node N111 or N115 when a signal at the signal generating source SD is changed from the logical voltage "L" to the logical voltage "H" is as shown by a signal level voltage curve 12. This is due to delays in the signal which are created by a capacitance including parasitic capacitances of the respective circuit cells C11 to C15 and the resistors R111 to R114.

In this circuit structure, a signal delay time at the node N113 is smallest and a signal delay time at the node N111 or N115 is largest. A difference between the smallest signal delay time and the largest signal delay time is smaller than that in the conventional structure (See FIG. 16). For example, if the resistance values between the respective circuit cells and the capacitance including the parasitic capacitances of the respective circuit cells remain unchanged, a signal delay time difference becomes approximately ¼ of that in the conventional structure.

In the present preferred embodiment, particularly by setting the resistance values of the resistors R111 to R114 smaller than the resistance value of the resistor R121, signal delay time differences between the nodes N111 and N115 (i.e., the circuit cells C11 to C15) are advantageously reduced. To increase the resistance value of the resistor R121, the widths of the wire lines may be shortened, for instance.

Further, the wire line which includes the resistor R121 and the wire line which includes the resistors R111 to R114 may be arranged in a planar configuration or three-dimensionally (multi-layer). When the wire lines are arranged in a planar configuration, only one wire line layer is necessary. When the wire lines are arranged three-dimensionally, the wire lines occupy only a small area.

<Second Preferred Embodiment>

Next, a second preferred embodiment will be described with reference to FIG. 3.

In the second preferred embodiment, six circuit cells C21 to C26 are respectively connected to six nodes N211 to N216, the nodes N211 and N212 are connected to each other through a resistor R211, the nodes N212 and N213 are connected to each other through a resistor R212, the nodes N214 and N215 are connected to each other through a resistor R213, and the nodes N215 and N216 are connected to each other through a resistor R214. However, the nodes N213 and N214 are not directly connected to each other in this embodiment. The node N217 is connected to the signal generating source SD through the resistor R231, and the nodes N212 and N215 are connected to the node N217 through the resistors R221 and R222, respectively.

In the electric signal supply circuit according to the present preferred embodiment, since the signal wire lines to the respective circuit cells C21 to C26 from the signal generating source SD are in the form of a pyramid, signal delay time differences to the respective circuit cells C21 to C26 are further reduced than in the first preferred embodiment.

<Third Preferred Embodiment>

Figure 4:
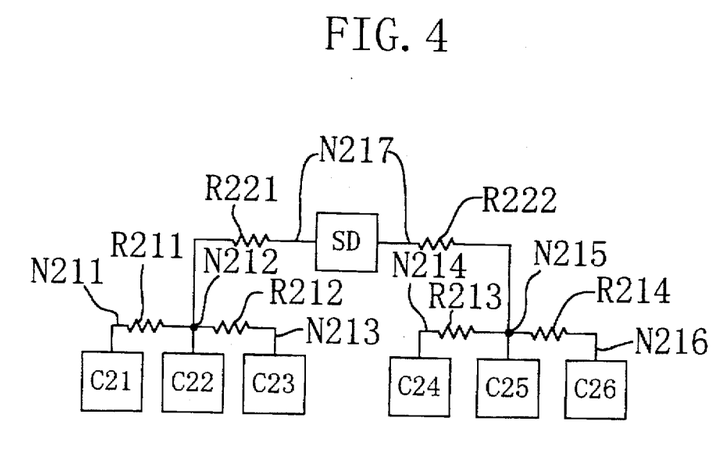
FIG. 4 is a circuitry block diagram showing a schematic structure of an electric signal supply circuit according to a third preferred embodiment.

Next, a third preferred embodiment will be described with reference to FIG. 4.

Figure 3:
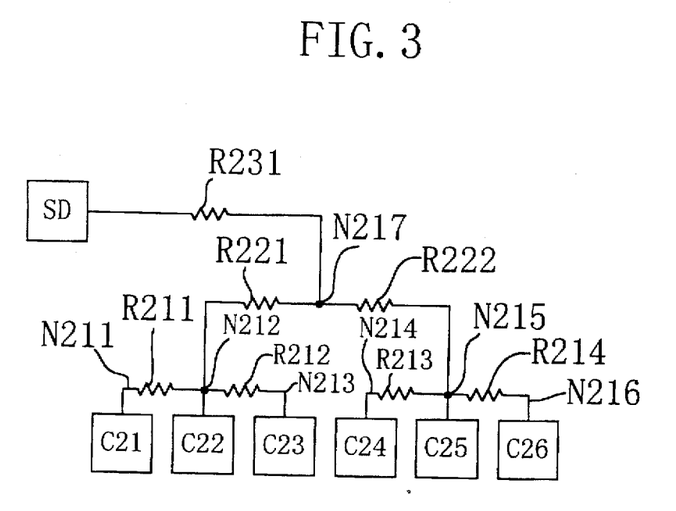
FIG. 3 is a circuitry block diagram showing a schematic structure of an electric signal supply circuit according to a second preferred embodiment.

Relationships with respect to connections between the respective circuit cells C21 to C26, the nodes N211 to N216, and the resistors R211 to R214 in the third preferred embodiment are similar to those in the second preferred embodiment which are shown in FIG. 3. However, in the third preferred embodiment, the signal generating source SD is connected to the node N212 through the resistor R221 and to the node N215 through the resistor R222. In other words, the signal generating source SD is located at the position of the node N217 in FIG. 3, omitting the resistor R231.

In the electric signal supply circuit according to the present preferred embodiment, as in the second preferred embodiment, the signal wire lines to the respective circuit cells from the signal generating source SD are in the form of a pyramid, and therefore, signal delay time differences to the respective circuit cells are further reduced than in the first preferred embodiment.

Further, since the circuit cells are arranged so that the wire lines from the signal generating source SD branch out directly in two directions, resistance values in the paths from the signal generating source SD to the circuit cells are reduced more by an amount which is equivalent to the absence of the resistor R231 than in the circuit according to the second preferred embodiment. Hence, the largest delay time to the farthest circuit cell from the signal generating source SD becomes smaller, which in turn allows the circuit as a whole to operate at a higher speed.

<Fourth Preferred Embodiment>

Next, a fourth preferred embodiment will be described with reference to FIG. 5.

Figure 5:
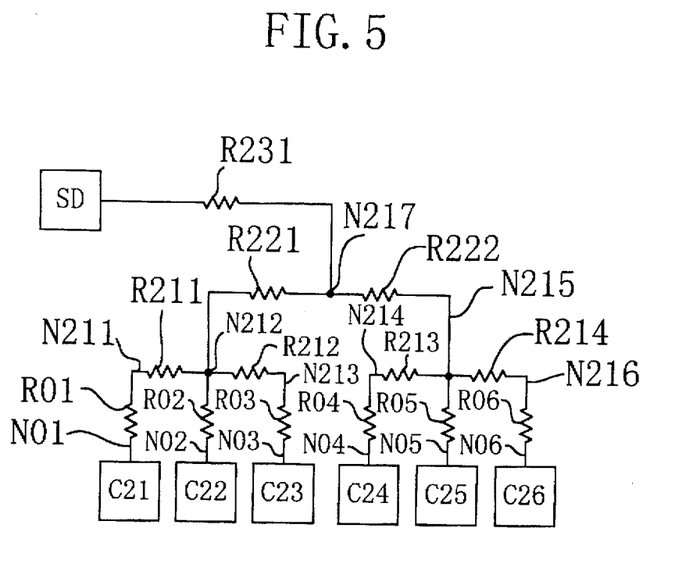
FIG. 5 is a circuitry block diagram showing a schematic structure of an electric signal supply circuit according to a fourth preferred embodiment.

As shown in FIG. 5, an electric signal supply circuit according to the fourth preferred embodiment is equal to the electric signal supply circuit according to the second preferred embodiment (See FIG. 3) as it is modified in structure to additionally insert resistors R11 to R06 between the nodes N211 to N216 and the circuit cells C21 to C26. More precisely, the resistor R01 is inserted between the nodes N201 and N211 which are connected to the circuit cell C21, the resistor R02 is inserted between the nodes N202 and N212 which are connected to the circuit cell C22, the resistor R03 is inserted between the nodes N203 and N213 which are connected to the circuit cell C23, the resistor R04 is inserted between the nodes N204 and N214 which are connected to the circuit cell C24, the resistor R05 is inserted between the nodes N205 and N215 which are connected to the circuit cell C25, and the resistor R06 is inserted between the nodes N206 and N216 which are connected to the circuit cell C26. Relationships with respect to connections between the respective nodes N211 to N216 and the signal generating source SD and an arrangement of the resistors N211 to N231 are as described in relation to the circuit shown in FIG. 3 according to the second preferred embodiment.

In the electric signal supply circuit according to the present preferred embodiment, as in the first and the second preferred embodiments, the signal wire lines to the respective circuit cells from the signal generating source SD are in the form of a pyramid, and therefore, delay time differences to the respective circuit cells are further reduced.

Further, in the fourth preferred embodiment, since the circuit cells C21 to C26 are connected through the resistors R01 to R06 from the respective nodes N211 to N216 which serve as wire line ends which are formed in the form of a pyramid, the capacitance including the parasitic capacitances of the respective circuit cells C21 to C26 does not easily exert an influence at the nodes N211 to N216. This consequently further reduces a delay time.

<Fifth Preferred Embodiment>

Next, a fifth preferred embodiment will be described with reference to FIGS. 6 to 8.

Figure 6:
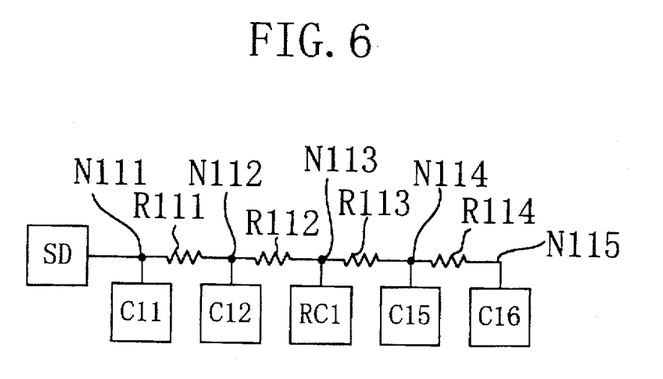
FIG. 6 is a block diagram showing a schematic structure of a ferroelectric memory device according to a fifth preferred embodiment.

FIG. 6 is a block diagram showing a schematic structure of a ferroelectric memory device according to the fifth preferred embodiment. As shown in FIG. 6, the circuit according to the fifth preferred embodiment has a structure which is equal to the semiconductor integrated circuit shown in FIG. 1 according to the first preferred embodiment as it is modified to replace the circuit cell C13, which is disposed at the center among the circuit cells C11 to C15, with a reference circuit cell RC1. The circuit cells C11, C12, C14 and C15 are main circuit cells.

Figure 7:
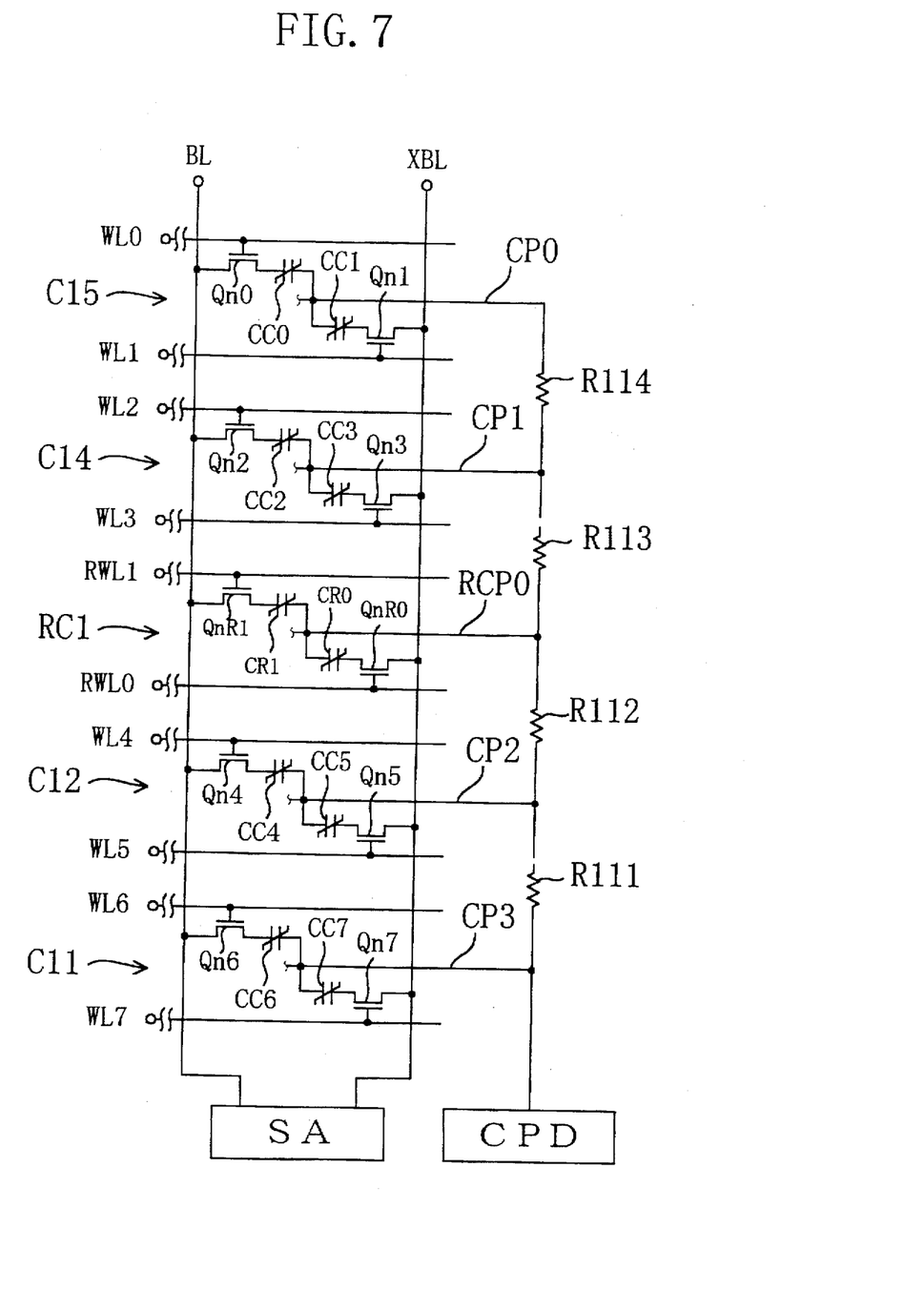
FIG. 7 is an electric circuitry diagram of the ferroelectric memory device according to the fifth preferred embodiment.

FIG. 7 is an electric circuitry diagram of a ferroelectric memory device which is a specific example of the semiconductor integrated circuit shown in FIG. 6. However, FIG. 7 shows only a portion of one of memory cell arrays which are formed in the ferroelectric memory device. In FIG. 7, a relationship between reference symbols and the names of the elements is as described below. Denoted at WL0 to WL7 are word lines, denoted at RWL0 and RWL1 are reference word lines, denoted at BL and XBL are a pair of bit lines for supplying a non-inverted bit line signal and an inverted bit line signal, respectively, denoted at CP0 to CP3 and RCP0 are cell plate electrodes, denoted at CPD is a cell plate signal supply source, denoted at SA is a sense amplifier, denoted at CC0 to CC7 are main memory cell capacitors formed by a ferroelectric material, denoted at CR0 and CR1 are reference memory cell capacitors formed by a ferroelectric material, and denoted at Qn0 to Qn7, QnR0 and QnR1 are N-channel type transistors. In FIG. 7, in other arrays as well, memory cells consisting of two memory capacitors and two N-channel type transistors are arranged. The cell plate electrodes CP and RCP extend along the row to connect the memory cell which are arranged in the row of the memory cell arrays to each other in FIG. 7.

As shown in FIG. 7, the ferroelectric memory device according to the present preferred embodiment is formed in the manner described below. The bit lines BL and XBL are connected to the sense amplifier SA. One electrodes of the main memory cell capacitors CC0 to CC7 are respectively connected to the bit line BL or XBL through the N-channel MOS type transistors Qn0 to Qn7, and gates of the N-channel MOS type transistors Qn0 to Qn7 are respectively connected to the word lines WL0 to WL7. Further, the other electrodes of the main memory cell capacitors CC0 and CC1 serve as the common cell plate electrode CP0, the other electrodes of the main memory cell capacitors CC2 and CC3 serve as the common cell plate electrode CP1, the other electrodes of the main memory cell capacitors CC4 and CC5 serve as the common cell plate electrode CP2, and the other electrodes of the main memory cell capacitors CC6 and CC7 serve as the common cell plate electrode CP3. In a similar manner, one electrodes of the reference memory cell capacitors CR0 and CR1 are respectively connected to the bit line BL or XBL through the N-channel MOS type transistors QnR0 and QnR1, and gates of the N-channel MOS type transistors QnR0 and QnR1 are respectively connected to the word lines RWL0 and RWL1. The other electrodes of the reference memory cell capacitors CR0 and CR1 serve as the common cell plate electrode CP0. The cell plate electrodes CP0 and CP1 are connected through the resistor R14, the cell plate electrodes CP1 and RCP0 are connected through the resistor R13, the cell plate electrodes RCP0 and CP2 are connected through the resistor R12, the cell plate electrodes CP2 and CP3 are connected through the resistor R11, and the cell plate electrode CP3 is connected to the cell plate signal supply source CPD. That is, the cell plate electrode RCP0 for the reference memory cell capacitors CR0 and CR1 is disposed at the center of the other cell plate electrodes CP0 to CP3.

The elements which are arranged within the ferroelectric memory device shown in FIG. 7 correspond to the elements which are arranged within the semiconductor integrated circuit shown in FIG. 6, in the following manner. The cell plate electrodes CP3, CP2, RCP1, CP1 and CP0 correspond to the nodes N111, N112, N113, N114 and N115, respectively, of FIG. 6. A memory cell consisting of the main memory cell capacitors CC0 and CC1, which are connected to the cell plate electrode CP0, and the N-channel type transistors Qn0 and Qn1 and memory cells which are arranged in this row but are not shown in FIG. 7 correspond to the main circuit cell C15 of FIG. 6. Similarly, the memory cells which are connected to the cell plate CP1 correspond to the main circuit cell C14 of FIG. 6. The reference memory cells which are connected to the cell plate electrode RCP0 correspond to the reference circuit cell RC1 of FIG. 6. In a similar manner, the memory cells which are connected to the cell plates CP2 and CP3 correspond to the main circuit cells C12 and C11 of FIG. 6.

In the present preferred embodiment, as shown in FIG. 7, since the reference memory cell capacitors CR0 and CR1 are disposed at the center of the main memory cell capacitors CC0 to CC7, differences in delay times in a signal which is supplied from the cell plate signal supply source CPD to the cell plate electrodes of the main memory cell capacitors and the reference memory cell capacitors become small. This eliminates an arrangement dependency of an electric charge quantity which is read to the bit line BL or XBL from the main memory cell capacitors and the reference memory cell capacitors upon the memory cells. This in turn allows a stable operation at a high speed, so that the ferroelectric memory device is highly reliable which does not easily malfunction even with degrading in or variations between the ferroelectric capacitors.

Figure 8:
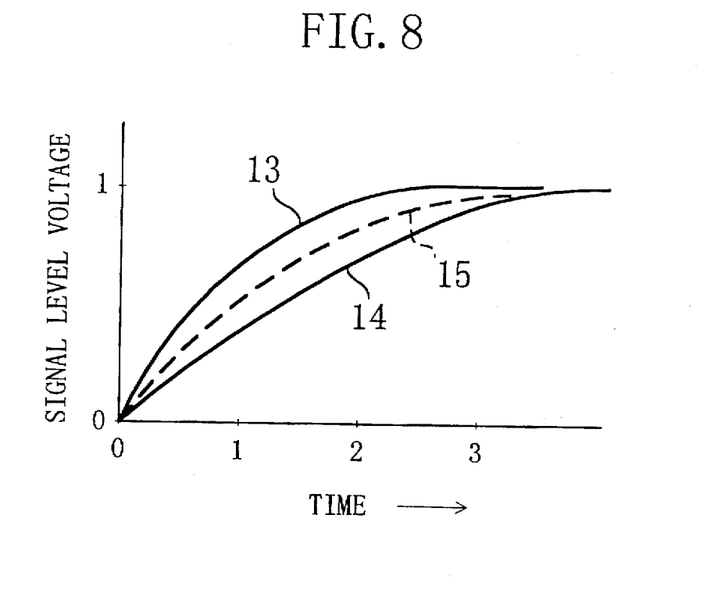
FIG. 8 is a diagram showing a relationship between time and a signal level voltage in the electric signal supply circuit according to the fifth preferred embodiment.

FIG. 8 shows changes with time in the signal levels at the respective nodes in the circuit of FIG. 6. In FIG. 8, a signal level voltage curve 13 expresses a signal level at the node N111, a signal level voltage curve 14 expresses a signal level at the node N115, and a signal level voltage curve 15 expresses a signal level at the node N113. In short, the signal level voltage curve 15 corresponding to the reference circuit cell RC1 extends between the signal level voltage curves 13 and 14 which correspond the largest delay among the main circuit cells. Thus, a difference in delay times between the reference circuit cells and the main circuit cells is smaller than in the conventional structure.

<Sixth Preferred Embodiment>

Next, a sixth preferred embodiment will be described with reference to FIG. 9.

Figure 9:
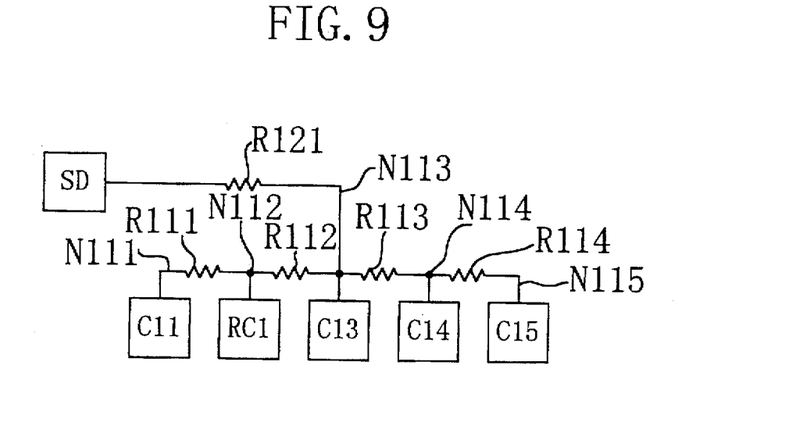
FIG. 9 is a block diagram showing a schematic structure of a ferroelectric memory device according to a sixth preferred embodiment.

As shown in FIG. 9, the circuit structure of a ferroelectric memory device according to the sixth preferred embodiment is equal to that of the electric signal supply circuit shown in FIG. 1 according to the first preferred embodiment as it is modified to replace the circuit cell C12, i.e., one of the six circuit cells C11 to C16, with the reference circuit cell RC1 which forms a reference memory cell. Relationships with respect to connections between the signal generating circuit SD, the respective nodes N111 to N115 and the resistors R111 to R114 and R121 are as described in relation to the circuit according to the first preferred embodiment shown in FIG. 1.

In the sixth preferred embodiment, the signal generating source SD is a cell plate signal supply source, for instance. In the electric signal supply circuit having such a structure, a delay time in a signal from the signal generating source SD is largest at the node N111 or N115, while a delay time in a signal from the signal generating source SD is smallest at the node N113. A delay time takes a mean value at the node N112 or N114. The resistance values of the resistors R111 to R121 or other appropriate values are set so that a delay time in a signal from the signal generating source SD to the reference circuit cell RC1 which forms a reference memory cell takes a mean value between the largest delay time and the smallest delay time in a signal from the signal generating source SD to the main circuit cells C11, C13, C14 and C15 which form main circuit cells.

Since the sixth preferred embodiment requires the ferroelectric memory device to have such a memory array structure, delay time differences from the signal generating source SD to the respective main circuit cells which form the main memory cells are smaller than in the fifth preferred embodiment. Further, since a delay time from the signal generating source SD to the reference circuit cell RC1 which forms a reference memory cell is set to take a mean value between the largest delay time and the smallest delay time in a signal from the signal generating source SD to the circuit cells C11, C13, C14 and C15 which form main circuit cells, the ferroelectric memory device performs a further stable operation at a higher speed.

<Seventh Preferred Embodiment>

Next, a seventh preferred embodiment will be described with reference to FIG. 10.

Figure 10:
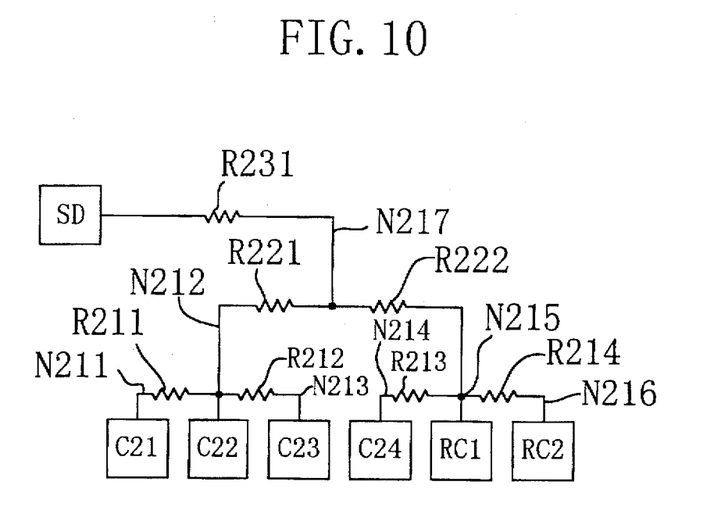
FIG. 10 is a block diagram showing a schematic structure of a ferroelectric memory device according to a seventh preferred embodiment.

As shown in FIG. 10, the circuit structure of a ferroelectric memory device according to the seventh preferred embodiment is equal to the circuit shown in FIG. 3 according to the second preferred embodiment to replace the two circuit cells C25 and C26 of the six circuit cells C21 to C26 with the reference circuit cells RC1 and RC2 which form reference memory cells. Relationships with respect to connections between the signal generating source SD, the respective nodes N211 to N217 and the resistors R211 to R214, R221 and R222 are as described in relation to the circuit according to the second preferred embodiment shown in FIG. 3.

Delay times from the signal generating source SD to the reference circuit cells RC1 and RC2 are set different from each other. When one of the circuit cells C21 to C24 forming main memory cells operates, a reference circuit cell having a delay time which is closest a delay time of a signal from the signal generating source SD to this circuit cell can be selected.

In the present preferred embodiment, since the ferroelectric memory device has such a structure shown in FIG. 10, delay time differences from the signal generating source SD to the respective circuit cells are further reduced than in the sixth preferred embodiment, which is similar to a manner in which the second preferred embodiment is more advantageous than the first preferred embodiment.

In addition to this, the reference circuit cells RC1 and RC2 are disposed at a plurality of positions, and one of the plurality of the reference circuit cells can be selected depending on positions at which the circuit cells forming main memory cells operate, that is, depending on delay times. Hence, by means of the circuit cells forming the main memory cells and the reference circuit cells forming the reference memory cells, delay time differences from the signal generating source SD are reduced, and therefore, the ferroelectric memory device having a particularly large memory capacity and a long signal wire line length from the signal generating source SD can operate stably at a high speed.

<Eighth Preferred Embodiment>

Next, an eighth preferred embodiment will be described with reference to FIGS. 11 and 12.

Figure 11:
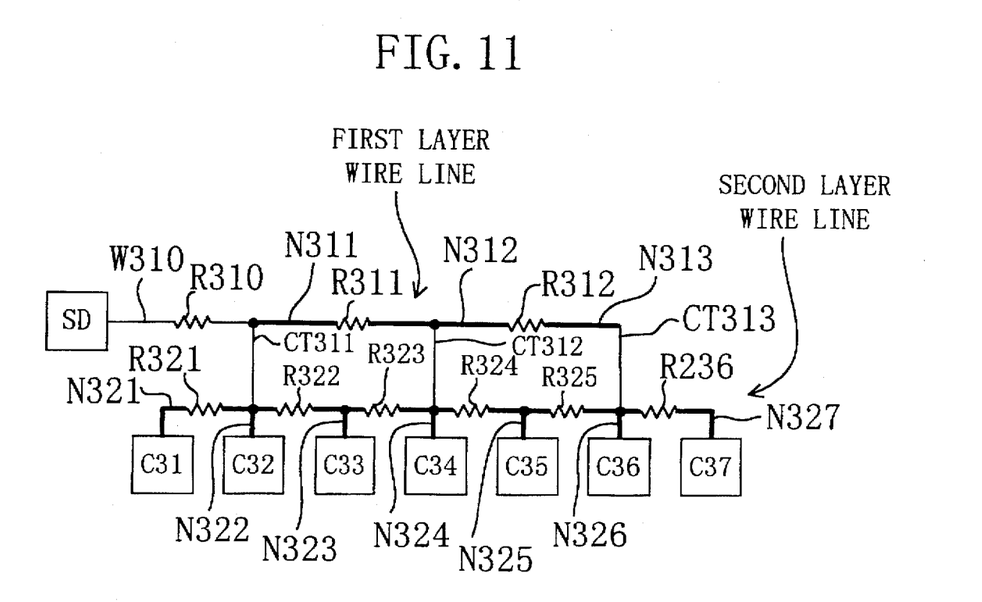
FIG. 11 is a block diagram showing a schematic structure of a ferroelectric memory device according to an eighth preferred embodiment.

As shown in FIG. 11, an electric signal supply circuit according to the eighth preferred embodiment comprises the signal generating source SD, a wire line W310 led from the signal generating source SD through a resistor R310, a first layer wire line which is connected to the wire line W310, seven circuit cells C31 to C37, and a second layer wire line which is connected to the circuit cells. Two resistors R311 and R312 are inserted in the first layer wire line, and six resistors R321 to R326 are inserted in the second layer wire line. In the eighth preferred embodiment, nodes are displayed separately between the first layer wire line and the second layer wire line. The first layer wire line is divided into three nodes N311 to N313 by the resistors R311 and R312. The second layer wire line is divided by the resistors R321 to R326 into seven nodes N321 to N327 which respectively directly contact the circuit cells C31 to C37. The eighth preferred embodiment is characterized in requiring to form a first to a third contacts CT311 to CT313 between the first layer wire line and the second layer wire line. More precisely, the node N311 in the first layer wire line is connected to the node N322 in the second layer wire line at the first contact CT311, the node N312 in the first layer wire line is connected to the node N324 in the second layer wire line at the second contact CT312, and the node N313 in the first layer wire line is connected to the node N326 in the second layer wire line at the third contact CT313. In other words, the resistors R311 and R312 are arranged in series to each other in the first layer wire line and the resistors R321 to R326 are arranged in series to each other in the second layer wire line, so that a signal is supplied to the plurality of nodes of the second layer wire line, through the plurality of contacts, from the plurality of nodes of the first layer wire line which are divided by the resistors R311 and R312.

In the electric signal supply circuit according to the eighth preferred embodiment, since the first layer wire line in which the resistors R311 and R312 are arranged is connected at the plurality of contacts to the second layer wire line in which the resistors R321 to R326 are arranged, a signal is supplied to the respective circuit cells except for the two at the both ends through the plurality of contacts, i.e., through a plurality of paths. Hence, delay time differences between the respective circuits C31 to C37 are reduced and a distance to the farthest circuit cell from the signal generating source SD is shortened, and therefore, it is possible to largely shorten even the largest delay time, i.e., a delay time of the system.

Further, in the eighth preferred embodiment, the plurality of contacts CT311 to CT313 are formed between the first layer wire line and the second layer wire line, a wire line length between an end of the second layer wire line and the first contact CT311 which is closest to the same is approximately half of a wire line length between the first contact CT311 and the second contact CT312. In other words, of all nodes N321, N322, N323, N324, N325, N326 and N327 which are arranged in the second layer wire line, the even-number nodes N322, N324 and N326 are connected to the first layer wire line. That is, when the number of the nodes in the second layer wire line is an odd number (2m+1) (where m is a natural number; m=3 in the eighth preferred embodiment), the number of the contacts with the first layer wire line is m. In the eighth preferred embodiment, since the widths of the wire lines are uniform, the resistance value of the resistor R321 between the end of the second layer wire line and the first contact CT311 which is closest to the same is approximately half of the resistance value of each of the resistors R322 and R323 (having equal resistance values to each other) which are formed between the first contact CT311 and the second contact CT312. That is, the resistance values of the resistors R321, R322, R323, R324, R325 and R326 are equal. When the signal wire lines are equal in the width, i.e., sectional area, the circuit cells are arranged with regular intervals. Thus, layout is simplified, which is advantageous in practical process.

Figure 12:
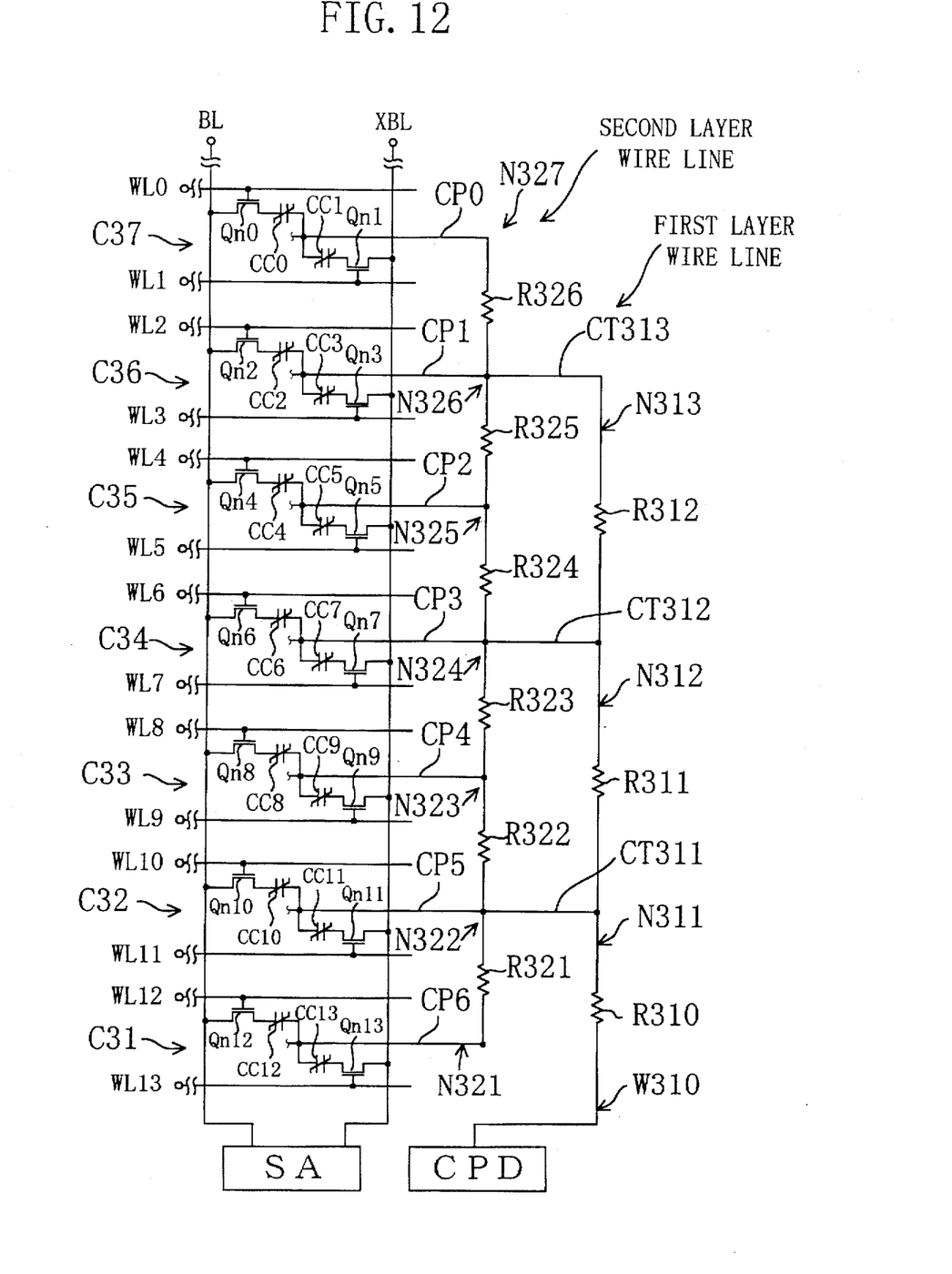
FIG. 12 is an electric circuitry diagram of the ferroelectric memory device according to the eighth preferred embodiment.

Next, FIG. 12 is a circuitry diagram of a memory cell array of a ferroelectric memory device which uses the circuit structure which is shown in FIG. 11. Unlike the example shown in FIG. 7, the eighth preferred embodiment shows only the main memory cells but omits the reference memory cells. However, the reference memory cells are located in other portions in this array. Further, although FIG. 12 shows only one array, needless to mention, there are a number of other arrays.

In FIG. 12, a relationship between reference symbols and the names of the elements is as described below. Denoted at WL0 to WL13 are word lines, denoted at BL and XBL are a pair of bit lines for supplying a non-inverted bit line signal and an inverted bit line signal, respectively, denoted at CP0 to CP6 are cell plate electrodes, denoted at CPD is a cell plate signal supply source which serves as a signal generating sources denoted at SA is a sense amplifier, denoted at CC0 to CC13 are main memory cell capacitors formed by a ferroelectric material, and denoted at Qn0 to Qn13 are N-channel type transistors. In FIG. 12, other arrays as well include memory cells consisting of pairs of two memory capacitors and two N-channel type transistors. Each cell plate electrode CP extends along the row to connect the memory cells which are arranged in the row of the memory cell array to each other in FIG. 12.

As shown in FIG. 12, the ferroelectric memory device according to the present preferred embodiment is formed in the manner described below. The bit lines BL and XBL are connected to the sense amplifier SA. One electrodes of the main memory cell capacitors CC0 to CC13 are respectively connected to the bit line BL or XBL through the N-channel type transistors Qn0 to Qn13, and gates of the N-channel type transistors Qn0 to Qn13 are respectively connected to the word lines WL0 to WL13. Further, the other electrodes of the pair of the main memory cell capacitors CC0 and CC1 and the pair of the main memory cell capacitors CC2 and CC3, etc., serve as the common cell plate electrodes CP0, CP1, . . . . The cell plate electrodes CP0 and CP1 are connected to each other through the resistor R326, the cell plate electrodes CP1 and CP2 are connected to each other through the resistor R325, the cell plate electrodes CP2 and CP3 are connected to each other through the resistor R324, the cell plate electrodes CP3 and CP4 are connected to each other through the resistor R323, the cell plate electrodes CP4 and CP5 are connected to each other through the resistor R322, and the cell plate electrodes CP5 and CP6 are connected to each other through the resistor R321. The contacts CT311 to CT313 are formed for every other cell plate electrodes CP5, CP3, CP1 counted from the first layer wire line.

In the ferroelectric memory device shown in FIG. 12, the memory cells which are arranged in the rows which are connected to the cell plate electrodes CP0 to CP6 correspond to the circuit cells C31 to C37 of FIG. 11.

Since the ferroelectric memory device according to the present preferred embodiment has such a structure as that shown in FIGS. 11 and 12, it is possible to reduce delay time differences between the main memory cells in the memory cell arrays as much as possible.

<Ninth Preferred Embodiment>

Next, a ninth preferred embodiment will be described with reference to FIG. 13.

Figure 13:
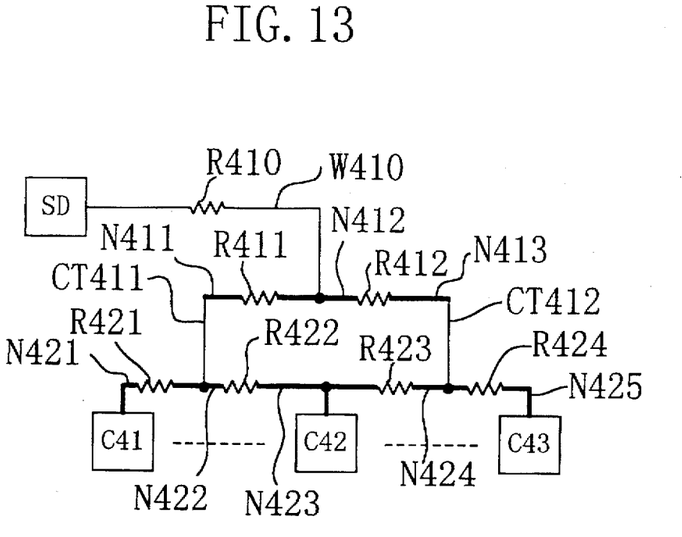
FIG. 13 is a block diagram showing a schematic structure of a ferroelectric memory device according to a ninth preferred embodiment.

As shown in FIG. 13, an electric signal supply circuit according to the ninth preferred embodiment comprises the signal generating source SD, a wire line W410 led from the signal generating source SD through a resistor R410, a first layer wire line which is connected to the wire line W410, a number of circuit cells including three circuit cells C41 to C43, and a second layer wire line which is connected between the respective circuit cells. Two resistors R411 and R412 are inserted in the first layer wire line, and four resistors R421 to R424 are inserted in the second layer wire line. The first layer wire line is divided by the resistors R411 and R412 into three nodes N411 to N413. The second layer wire line is divided by the resistors R421 to R424 into five nodes N421 to N425. The ninth preferred embodiment is characterized in requiring that the node N411 in the first layer wire line is connected to the node N422 in the second layer wire line at a first contact CT411 and the node N413 in the first layer wire line is connected to the node N424 in the second layer wire line at a second contact CT412. However, no contact is formed between the central node N412 in the first layer wire line and the node N423 in the second layer wire line.

Further, the ninth preferred embodiment requires to set the resistance values r22 and r23 of the two resistors R422 and R423 which are arranged in a path which is connected to the circuit cell C42 which receives an electric charge (i.e., signal) from two directions are in the following relationship (1) with the resistance value r21 of the resistor R421 which is arranged in a path which is connected to the circuit cell C41 which receives an electric charge only from one direction:

$$r21 : r22 \ (=r23) = 1 : \sqrt{2} \tag{1}$$

A similar relationship is held between the resistance value of the resistor R424 which is arranged in a path which is connected to the circuit cell C43 which is disposed at the other end portion and the resistance values of the two resistors R422 and R423 which are arranged in a path which is connected to the central circuit cell C42. Meanwhile, the resistance value of the resistor R411 and the resistance value of the resistor R412 are set to be equal to each other. Setting in this manner allows delay times to the circuit cells C41 and C42 to be equal to each other. This will be described in the following. If the capacities of the circuit cells C41 and C42 are equally CA1, from a condition expressed by the equation (2) below that delay times in a signal to these two circuit cells from the first layer wire line are equal to each other, the equation (1) above is obtained:

$$r21 \times \alpha \cdot r21 \cdot CA = (r22/2) \cdot r22 \cdot CA \tag{2}$$

Since the ninth preferred embodiment requires to set the values as describe above, a structure which as a whole has small delay time differences is achieved. Further, as in the eighth preferred embodiment described earlier, since a distance to the farthest circuit cell from the signal generating source SD is shortened, it is possible to largely shorten even the largest delay time, i.e., a delay time of the system. Only if the resistance value of the resistor R422 is larger than the resistance value of the resistor R421, an effect of reducing delay time differences between the circuit cells C41 and C42 as much as possible is guaranteed.

Although not shown in FIG. 13, the structure according to the ninth preferred embodiment can be applied to the structure of the memory cell array of the ferroelectric memory device as that shown in FIG. 12, which is needless to mention.

Where a plurality of contacts are formed between the first layer wire line and the second layer wire line, the method of arranging the contacts is not limited to that described above in relation to the ninth preferred embodiment.

<Tenth Preferred Embodiment>

Next, a tenth preferred embodiment will be described with reference to FIG. 14.

Figure 14:
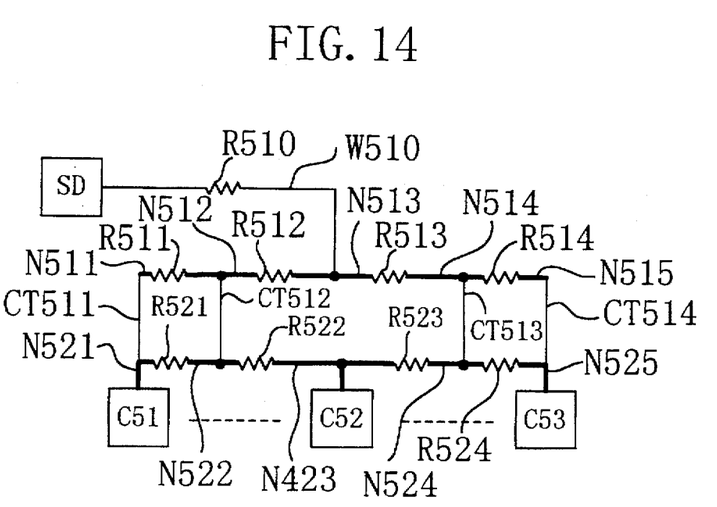
FIG. 14 is a block diagram showing a schematic structure of a ferroelectric memory device according to a tenth preferred embodiment.

As shown in FIG. 14, an electric signal supply circuit according to the tenth preferred embodiment comprises the signal generating source SD, a wire line W510 led from the signal generating source SD through a resistor R510, a first layer wire line which is connected to the wire line W510, a number of circuit cells including three circuit cells C51 to C53, and a second layer wire line which is connected between the respective circuit cells. Four resistors R511 to R514 are inserted in the first layer wire line, and four resistors R521 to R524 are inserted in the second layer wire line. In the tenth preferred embodiment, nodes are displayed separately between the first layer wire line and the second layer wire line. The first layer wire line is divided into five nodes N511 to N515 by the resistors R511 to R514. The second layer wire line is divided by the resistors R521 to R524 into five nodes N521 to N525. The tenth preferred embodiment is characterized in requiring to form a first to a fourth contacts CT511 to CT514 between the first layer wire line and the second layer wire line. More precisely, the node N511 in the first layer wire line is connected to the node N521 in the second layer wire line at the first contact CT511, the node N512 in the first layer wire line is connected to the node N522 in the second layer wire line at the second contact CT512, the node N514 in the first layer wire line is connected to the node N524 in the second layer wire line at the third contact CT513, and the node N515 in the first layer wire line is connected to the node N525 in the second layer wire line at the fourth contact CT514. However, no contact is formed between the central node N513 in the first layer wire line and the node N523 in the second layer wire line. In other words, the structure of the electric signal supply circuit according to the tenth preferred embodiment is equal to the structure according to the ninth preferred embodiment described earlier as it is modified to additionally form contacts at the nodes at the both ends of the second layer wire line through the resistors.

In the tenth preferred embodiment, since both the circuit cell C51 which is disposed at the end (and also the circuit cell C53) and the circuit cell C52 which is disposed at the center receive an electric charge from two directions, if the composite resistance value of the resistors R511 and R521 is set equal to the composite resistance value of the resistors R512 and R522, delay times to the both circuit cells are set equal to each other. The resistance values of the resistors R512 and R513 are equal to each other.

Hence, the tenth preferred embodiment as well realizes a structure which as a whole has small delay time differences. The structure according to the tenth preferred embodiment, in particular, allows easier adjustment of the resistance values of the respective resistors than in the ninth preferred embodiment. Further, as in the eighth preferred embodiment described earlier, since a distance to the farthest circuit cell from the signal generating source SD is shortened, it is possible to largely shorten even the largest delay time, i.e., a delay time of the system.

Although not shown in FIG. 14, the structure according to the tenth preferred embodiment can be applied to the structure of the memory cell array of the ferroelectric memory device as that shown in FIG. 12, which is needless to mention.

Where a plurality of contacts are formed between the first layer wire line and the second layer wire line, the method of arranging the contacts is not limited to that described above in relation to the tenth preferred embodiment.

What is claimed is:

1. An electric signal supply circuit, comprising:
   a plurality of circuit cells including at least a first circuit cell and a second circuit cell;
   an electric signal generating source for generating a signal which is to be supplied to each one of said circuit cells; and
   a wire line which is lead from said electric signal generating source and connected at tip with each one of said circuit cells,
   wherein a resistance value in the wire line between said electric signal generating source and said first circuit cell is set approximately the same as a resistance value in said wire line between said electric signal generating source and said second circuit cell.

2. An electric signal supply circuit, comprising:
   a plurality of circuit cells, including at least one first circuit cell and at least one second circuit cell;
   an electric signal generating source for generating a signal which is to be supplied to each one of said circuit cells; and
   a wire line which is lead from said electric signal generating source, branched out in a hierarchy configuration and connected at tip with each one of said circuit cells,
   wherein a resistance value in said wire line between said electric signal generating source and said first circuit cell is set approximately the same as a resistance value in said wire line between said electric signal generating source and said second circuit cell.

3. An electric signal supply circuit in accordance with claim 2, wherein said wire line includes a first hierarchy layer which is led from said electric signal generating source and a second hierarchy layer which is branched out at one branching point from said first hierarchy layer and connected at tip to each one of said circuit cells,
   and a resistance value in said wire line from said electric signal generating source to said branching point in said first hierarchy layer is larger than a resistance value in said wire line between said circuit cells in said second hierarchy layer.

4. An electric signal supply circuit in accordance with claim 2, wherein said wire line includes a first hierarchy layer which is led from said electric signal generating source and a second hierarchy layer which is branched out at one branching point from said first hierarchy layer and connected at tip to each one of said circuit cells, and tip portions in said second hierarchy layer are connected to said circuit cells through resistors.

5. An electric signal supply circuit in accordance with claim 4, wherein resistance values of said resistors are larger than a resistance value in said wire line from said electric signal generating source to said branching point in said first hierarchy layer and than a resistance value in said wire line between said circuit cells in said second hierarchy layer.

6. An electric signal supply circuit, comprising:
   a plurality of circuit cells;
   an electric signal generating source for generating a signal which is to be supplied to each one of said circuit cells;
   a first layer wire line which is connected to said electric signal generating source; and
   a second layer wire line which is connected to each one of said circuit cells,
   wherein said first layer wire line and said second layer wire line are connected to each other at a plurality of contacts including at least a first contact and a second contact, and
   an electric signal is supplied from said electric signal generating source through at least said two contacts to at least circuit cells except for circuit cells which are disposed at the both ends.

7. An electric signal supply circuit in accordance with claim 6, wherein a resistance value in a path between one end portion of said second layer wire line and said first contact is approximately half a resistance value in a path between said first contact and said second contact in said second layer wire line.

8. An electric signal supply circuit in accordance with claim 6, wherein none of said plurality of contacts exit at end portions in said wire line in said second layer wire line.

9. An electric signal supply circuit in accordance with claim 6, wherein a wire length between one end portion of said second layer wire line and said first contact is approximately half a wire length between said first contact and said second contact in said second layer wire line.

10. An electric signal supply circuit in accordance with claim 6, wherein said circuit cells include at least a first, a second and a third circuit cells,
    a first resistor and a second resistor are arranged in said first layer wire line in this order from one end thereof, said first layer wire line is divided by said resistors into a first node to a third node in this order from the one end thereof,
    a first resistor to a fourth resistor are arranged in said second layer wire line in this order from one end thereof which corresponds to said one end of said first layer wire line, said second layer wire line is divided by said resistors into a first node to a fifth node in this order from said one end thereof, said first, said third and said fifth nodes are connected to said first, said second and said third circuit cells, respectively,
    said first contact is formed between said first node in said first layer wire line and said second node in said second layer wire line,
    said second contact is formed between said third node in said first layer wire line and said fourth node in said second layer wire line,
    said electric signal generating source is connected to said second node in said first layer wire line,
    and the resistance value of said second resistor is larger than the resistance value of said first resistor in said second layer wire line.

11. An electric signal supply circuit in accordance with claim 10, wherein the resistance value of said first resistor in said first layer wire line is approximately the same as the resistance value of said second resistor in said first layer wire line, and the resistance value of said second resistor is $\sqrt{2}$ times as large as the resistance value of said first resistor.

12. An electric signal supply circuit in accordance with claim 6, wherein said circuit cells includes at least a first, a second and a third circuit cells, a first resistor to a fourth resistor are arranged in said first layer wire line in this order from one end thereof, said first layer wire line is divided by the resistors into a first node to a fifth node in this order from the one end thereof, a first resistor to a fourth resistor are arranged in said second layer wire line in this order from one end thereof which corresponds to said one end of said first layer wire line, said second layer wire line is divided by the resistors into a first node to a fifth node in this order from said one end thereof, said first, said third and said fifth nodes are connected to said first, said second and said third circuit cells, respectively, said first, said second, said fourth and said fifth nodes are connected to each other at a first, a second, a third and a fourth contacts, respectively, between said first layer wire line and said second layer wire line, said electric signal generating source is connected to said second node in said first layer wire line, the resistance value of said first resistor is approximately equal to the resistance value of said first resistor in said first layer wire line, the resistance value of said first resistor in said first layer wire line is approximately equal to the resistance value of said third resistor in said second layer wire line, and the resistance value of said second resistor is approximately equal to the resistance value of said first resistor in said second layer wire line.

13. A semiconductor memory device, comprising:

a plurality of circuit cells, including a first and a second circuit cells which function as main memory cells and a third circuit cell which functions as a reference memory cell; and an electric signal generating source which is connected to each one of said circuit cells through wire lines, said electric signal generating source generating a signal which is supplied to each one of said circuit cells, wherein of resistance values in said wire lines between said electric signal generating source and said circuit cells, the largest resistance value is the resistance value in said wire lines between said electric signal generating source and said first circuit cell, of resistance values in said wire lines between said electric signal generating source and said circuit cells, the smallest resistance value is the resistance value in said wire lines between said electric signal generating source and said second circuit cell, and the resistance value in said wire lines between said electric signal generating source and said third circuit cell is set as a value between the largest resistance value and the smallest resistance value.

14. A semiconductor memory device, comprising:

a plurality of circuit cells, including at least one first circuit cell and at least one second circuit cell which function as main memory cells and at least one third circuit cell which functions as a reference memory cell; and an electric signal generating source which is connected to each one of said circuit cells through wire lines, said electric signal generating source generating a signal which to supplied to each one of said circuit cells, wherein said third circuit cell is disposed between said first and second circuit cells, and the total number of said at least one first circuit cell and said at least one second circuit cell is larger than the number of said at least one third circuit cell.

15. A semiconductor memory device, comprising:

a plurality of circuit cells; and an electric signal generating source which is connected to each one of said circuit cells through wire lines, said electric signal generating source generating a signal which is supplied to each one of said circuit cells, wherein said plurality of circuit cells consist of a plurality of main memory cells and a plurality of reference memory cells.

16. A semiconductor memory device in accordance with claim 15, wherein said plurality of circuit cells include a first and a second circuit cells which function as main memory cells and a third and a fourth circuit cells which function as reference memory cells, a resistance value in said wire lines between said electric signal generating source and said first circuit cell is approximately equal to a resistance value in said wire lines between said electric signal generating source and said third circuit cell, and a resistance value in said wire lines between said electric signal generating source and said second circuit cell is approximately equal to a resistance value in said wire lines between said electric signal generating source and said fourth circuit cell.

17. A semiconductor memory device in accordance with claim 15, wherein said plurality of circuit cells include a first and a second circuit cells which function as main memory cells and a third and a fourth circuit cells which function as reference memory cells, said first circuit cell and said third circuit cell are selected at the same time, while said second circuit cell and said fourth circuit cell are selected at the same time.

18. A semiconductor memory device in accordance with claim 15, wherein said plurality of circuit cells include a first and a second circuit cells which function as main memory cells and a third and a fourth circuit cells which function as reference memory cells, a resistance value in said wire lines between said electric signal generating source and said first circuit cell is approximately equal to a resistance value in said wire lines between said electric signal generating source and said third circuit cell, a resistance value in said wire lines between said electric signal generating source and said second circuit cell is approximately equal to a resistance value in said wire lines between said electric signal generating source and said fourth circuit cell, and said first circuit cell and said third circuit cell are selected at the same time, while said second circuit cell and said fourth circuit cell are selected at the same time.

* * * * *